(12) United States Patent
Tsuyuno et al.

(10) Patent No.: US 11,367,671 B2
(45) Date of Patent: Jun. 21, 2022

(54) POWER SEMICONDUCTOR DEVICE

(71) Applicant: Hitachi Astemo, Ltd., Hitachinaka (JP)

(72) Inventors: Nobutake Tsuyuno, Tokyo (JP); Hiroshi Houzouji, Hitachinaka (JP)

(73) Assignee: HITACHI ASTEMO, LTD., Ibaraki (JP)

( * ) Notice: Subject to any disclaimer, the term of this patent is extended or adjusted under 35 U.S.C. 154(b) by 33 days.

(21) Appl. No.: 16/768,215

(22) PCT Filed: Dec. 11, 2018

(86) PCT No.: PCT/JP2018/045407
§ 371 (c)(1),
(2) Date: May 29, 2020

(87) PCT Pub. No.: WO2019/142545
PCT Pub. Date: Jul. 25, 2019

(65) Prior Publication Data
US 2020/0294888 A1   Sep. 17, 2020

(30) Foreign Application Priority Data

Jan. 17, 2018 (JP) .............................. JP2018-005309

(51) Int. Cl.
*H01L 23/473* (2006.01)
*H01L 23/42* (2006.01)

(52) U.S. Cl.
CPC ............ *H01L 23/473* (2013.01); *H01L 23/42* (2013.01)

(58) Field of Classification Search
CPC . H01L 23/473; H01L 23/42; H01L 23/49541; H01L 23/49548;
(Continued)

(56) References Cited

U.S. PATENT DOCUMENTS

2011/0316142 A1   12/2011   Noritake et al.
2011/0318884 A1*  12/2011   Noritake ............. H01L 23/3135
                                                        438/122
2012/0087095 A1    4/2012   Tokuyama et al.

FOREIGN PATENT DOCUMENTS

JP    2006-158020 A    6/2006
JP    2010-258315 A   11/2010
(Continued)

OTHER PUBLICATIONS

International Search Report, PCT/JP2018/045407, dated Feb. 26, 2019, 2 pgs.

*Primary Examiner* — Tucker J Wright
(74) *Attorney, Agent, or Firm* — Volpe Koenig

(57) ABSTRACT

An object of the invention is to improve the reliability of a power semiconductor device. The power semiconductor device according to the invention includes a semiconductor element, a first terminal and a second terminal that transmit current to the semiconductor element, a first base and a second base that are disposed to face each other while interposing a part of the first terminal, a part of the second terminal, and the semiconductor element between the first base and the second base, and a sealing material that is provided in a space between the first base and the second base. The second terminal includes an intermediate portion formed in such a way that a distance from the first terminal increases along a direction away from the semiconductor element. The intermediate portion is provided between the first base and the second base and in the sealing material.

3 Claims, 13 Drawing Sheets

(58) Field of Classification Search
CPC ......... H01L 23/49551; H01L 23/49555; H01L 25/072; H01L 25/115
See application file for complete search history.

(56) References Cited

FOREIGN PATENT DOCUMENTS

| | | |
|---|---|---|
| JP | 2012-009568 A | 1/2012 |
| JP | 2016-066700 A | 4/2016 |

* cited by examiner

POWER SEMICONDUCTOR DEVICE

TECHNICAL FIELD

The present invention relates to a power semiconductor device, and more particularly, to a power semiconductor device having a power semiconductor element corresponding to high power.

BACKGROUND ART

Power conversion devices based on switching of power semiconductor elements have high conversion efficiencies and are therefore widely used in consumer applications, in-vehicle applications, railway applications, substation facilities, and the like.

Since the power semiconductor element generates heat when energized, high heat dissipation is required. In particular, for in-vehicle applications, a highly efficient cooling system using water cooling is employed for miniaturization and weight reduction. PTL 1 discloses a power semiconductor device that cools both surfaces of the power semiconductor element.

In the power semiconductor device described in PTL 1, a water channel is formed by molding a semiconductor device resin-molded with a thermosetting resin with a thermoplastic resin. In this water channel, the cooling water is always in contact with the resin, so that the resin absorbs moisture up to a saturated state, as a result, there is a possibility that water diffused to a minute peeling portion at the interface between the semiconductor element and the resin is precipitated.

CITATION LIST

Patent Literature

PTL 1: JP 2012-9568 A

SUMMARY OF INVENTION

Technical Problem

An object of the invention is to improve the reliability of a power semiconductor device.

Solution to Problem

The power semiconductor device according to the invention includes a semiconductor element, a first terminal and a second terminal that transmit current to the semiconductor element, a first base and a second base that are disposed to face each other while interposing a part of the first terminal, a part of the second terminal, and the semiconductor element between the first base and the second base, and a sealing material that is provided in a space between the first base and the second base. The second terminal includes an intermediate portion formed in such a way that a distance from the first terminal increases along a direction away from the semiconductor element. The intermediate portion is provided between the first base and the second base and in the sealing material.

Advantageous Effects of Invention

According to the invention, the reliability of a power semiconductor device can be improved.

DESCRIPTION OF EMBODIMENTS

Figure 1:
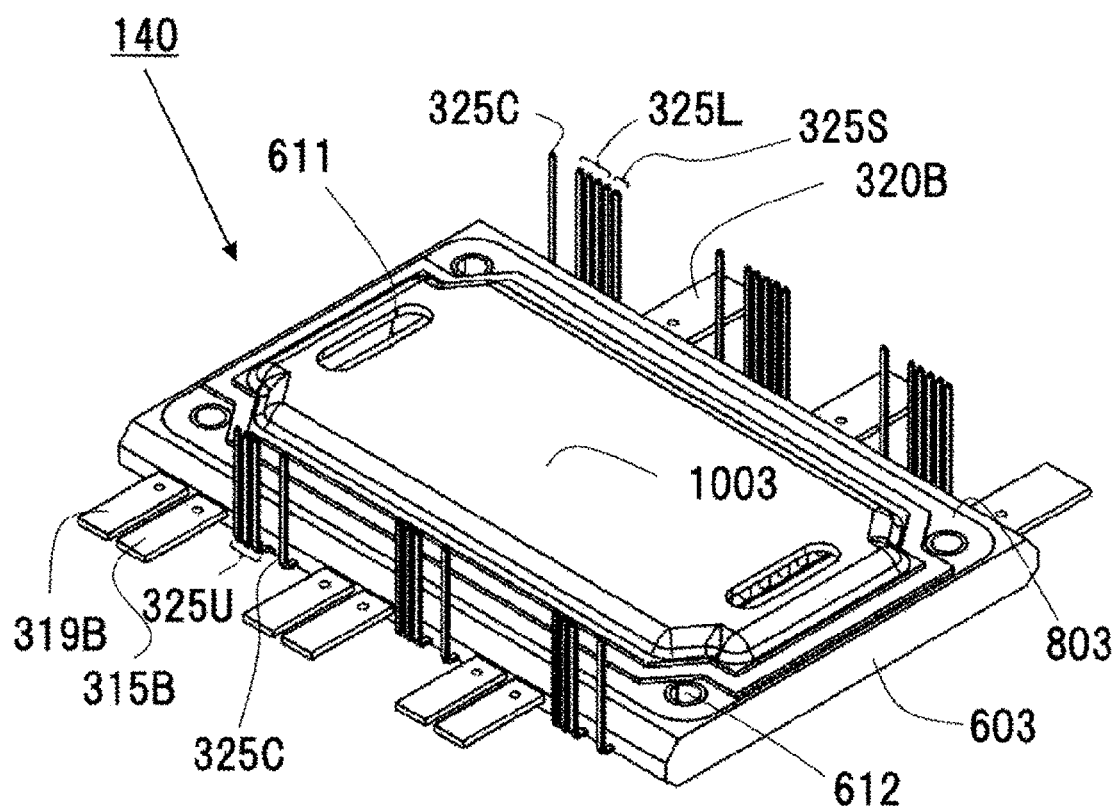
FIG. 1 is an overall perspective view on a front side of a power semiconductor device 140 according to this embodiment.

Before describing embodiments of the invention, the principle of the invention will be described.

One configuration according to the invention includes a first terminal and a second terminal that transmit current to a semiconductor element, a first base and a second base that interpose a part of the first terminal, a part of the second terminal, and the semiconductor element between the first base and the second base and are disposed to face each other, and a sealing member provided in a space between the first base and the second base. The second terminal includes an intermediate portion formed in such a way that a distance from the first terminal increases along a direction away from the semiconductor element. The intermediate portion is provided between the first base and the second base and in the sealing material.

According to the invention, since the first base and the second base made of metal are provided on both sides of the semiconductor element, a cooling water does not come into contact with the sealing material while cooling both sides of the semiconductor element. Therefore, there is no moisture absorption of the sealing material by the cooling water, and there is an effect that the insulation property is excellent.

Further, since the second terminal is formed so that the terminal interval increases along the direction away from the semiconductor element, there is an effect that the creepage distance and the space distance to be satisfied by the high-voltage device can be easily secured. On the other hand, if the terminal interval is extended without increasing an expensive insulating substrate on which a semiconductor element is mounted for cost reduction, the distance between terminals located outside the power semiconductor device is increased. As the distance between the second terminals increases, the electric resistance increases and the amount of heat generated increases.

In the case of a small power semiconductor device with an external size of 170 mm or less in a longitudinal direction from which the second terminal protrudes, when a large current of 300 A or more is applied, the amount of heat generated increases as compared with the case where the terminal protrudes from the sealing material at the shortest distance. This causes a new problem that the temperature exceeds the glass transition temperature of the sealing material that seals the terminal, and the adhesion between the sealing material and the terminal decreases.

With this regard, as in the invention, the intermediate portion formed in such a way that the distance from the first terminal increases along the direction away from the semiconductor element is interposed between the first base and the second base, as a result the cooling performance of the second terminal is improved, and a large current can be effectively applied. Further, since the first base and the second base are collectively sealed with a sealing material, the productivity is effectively increased.

Hereinafter, a power semiconductor device used in a power conversion device mounted on a vehicle will be described as an embodiment of a structure according to the invention. In the embodiments of the power semiconductor device described below, each of components such as a power semiconductor element as a heat generating element, a power semiconductor unit having the power semiconductor element mounted thereon, a base having a fin portion as a heat dissipation plate having the power semiconductor unit mounted thereon, an input/output terminal of the power semiconductor unit, a sealing material for collectively sealing the power semiconductor unit and the base, a water channel cover for forming a water channel, and a flow path forming portion for connecting the upper and lower water channels will be described with reference to the drawings. Further, the same element in the drawings will be attached with the same symbol, and the redundant description will be omitted.

Figure 2:
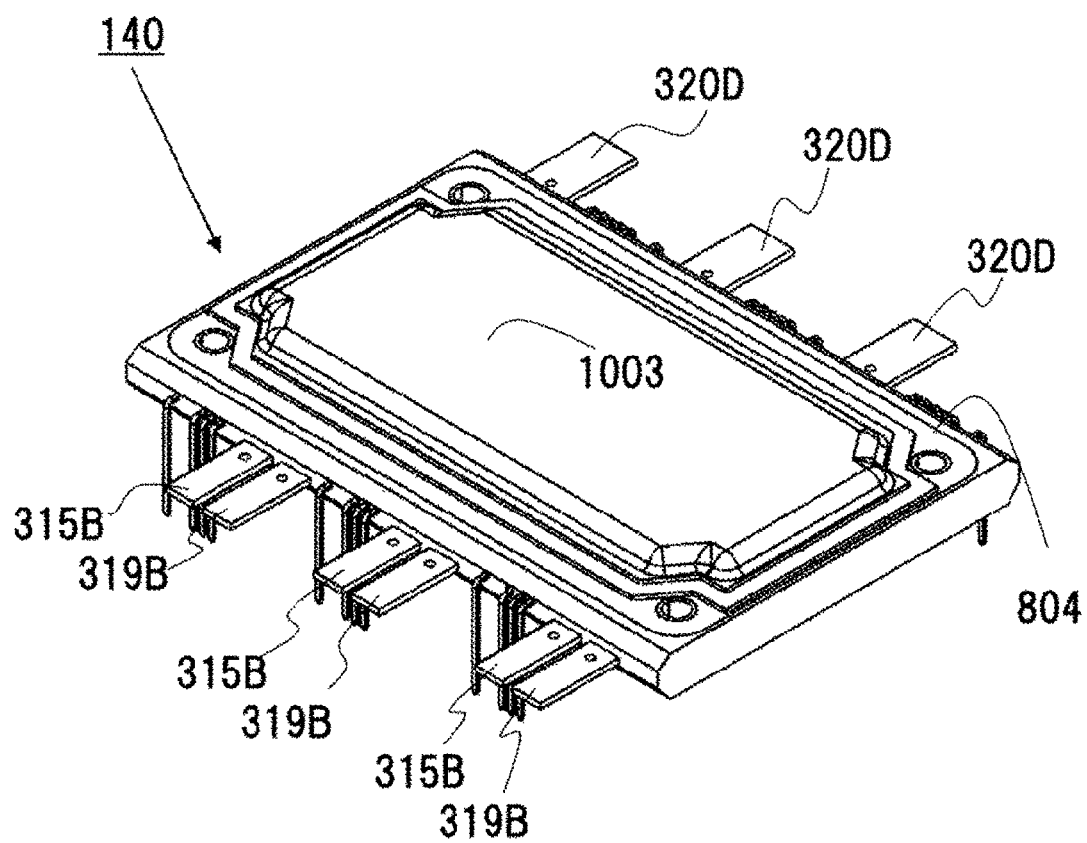
FIG. 2 is an overall perspective view on a rear side of the power semiconductor device 140 according to this embodiment.
Figure 3:
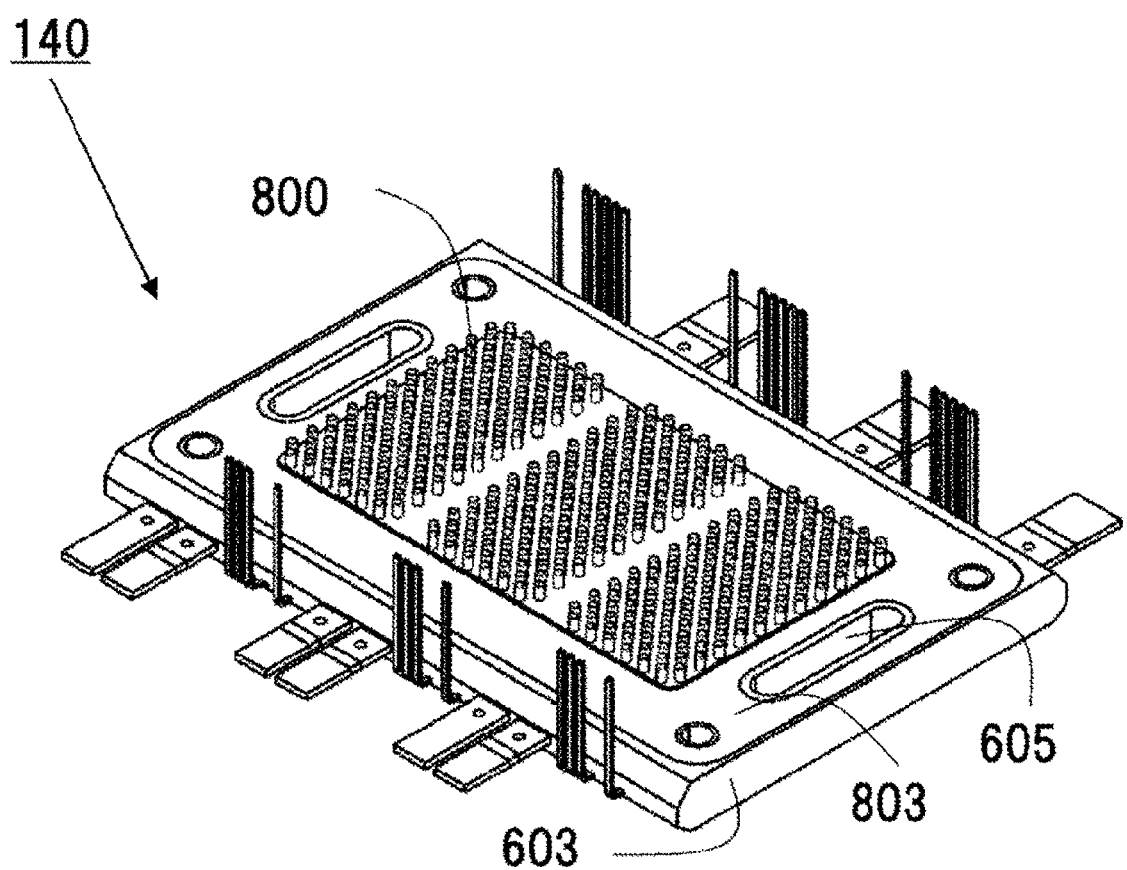
FIG. 3 is an overall perspective view of the front side of the power semiconductor device 140 from which a flow path cover 1003 has been removed.
Figure 4:
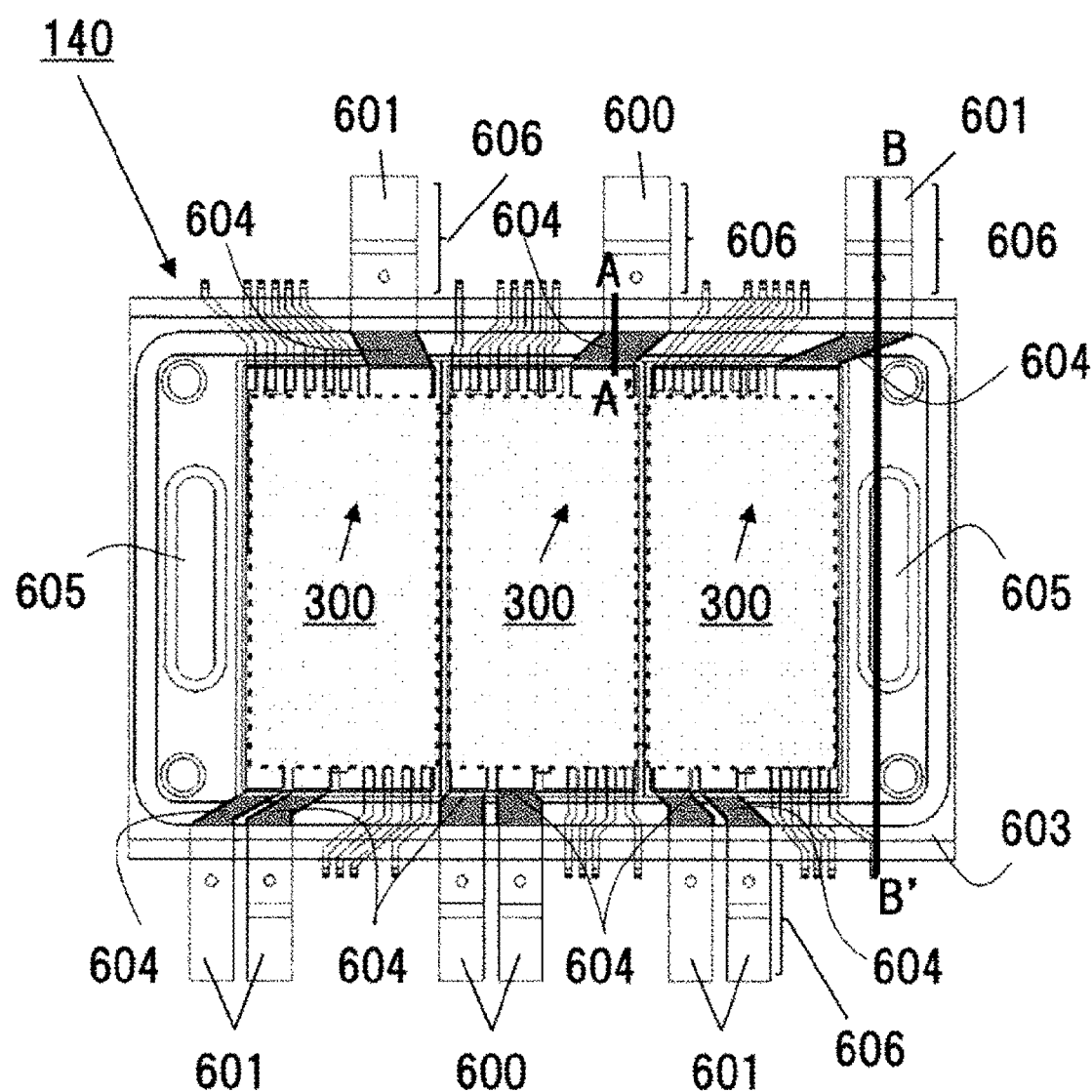
FIG. 4 is a transparent front view of the power semiconductor device 140.
Figure 5:
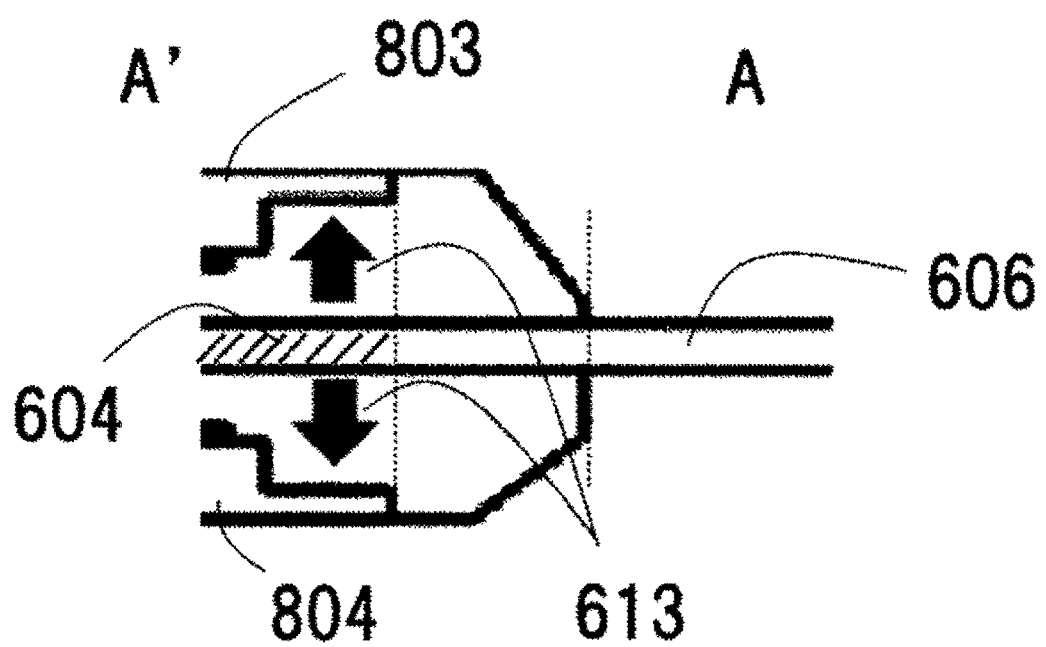
FIG. 5 is a cross-sectional view of a power semiconductor unit 300 with respect to a cross section taken along line AA in FIG. 4.
Figure 6:
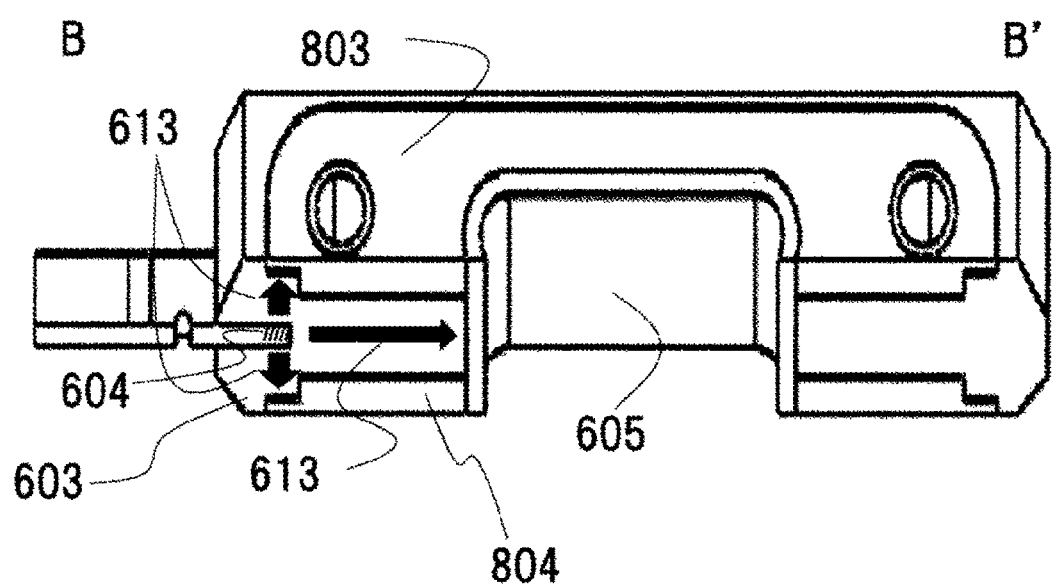
FIG. 6 is a cross-sectional view of the power semiconductor unit 300 with respect to a cross section passing through a line BB in FIG. 4.

FIG. 1 is an overall perspective view on the front side of a power semiconductor device 140 according to this embodiment. FIG. 2 is an overall perspective view on the rear side of a power semiconductor device 140 according to this embodiment. FIG. 3 is an overall perspective view on the front side of the power semiconductor device 140 from which a flow path cover 1003 has been removed. FIG. 4 is a transparent front view of the power semiconductor device 140. FIG. 5 is a cross-sectional view of a power semiconductor unit 300 with respect to a cross section taken along line AA in FIG. 4. FIG. 6 is a cross-sectional view of the power semiconductor unit 300 relating to a cross-section passing through line BB of FIG. 4.

The power semiconductor unit 300 is a circuit body incorporating a semiconductor element 860 described later. As illustrated in FIGS. 1 and 6, three power semiconductor units 300 are arranged in a line. The power semiconductor unit 300 has a 2-in-1 structure in which two arm circuits, an upper arm circuit and a lower arm circuit, are integrated into one module. When a 3-in-1 structure, a 4-in-1 structure, a 6-in-1 structure, or the like is used in addition to the 2-in-1 structure, the number of output terminals from the power semiconductor device can be reduced and the size can be reduced.

The collector sense signal terminal 325C, the lower arm gate signal terminal 325L, and the temperature sense signal terminal 325S transmit an electric signal between the power semiconductor unit 300 and the control board or the driver board. After protruding from two surfaces of the power semiconductor device 140, these signal terminals are turned in the same direction by bending in order to connect to a control circuit and a driver circuit. Dividing the signal terminals into two surfaces has an effect of easily securing a creepage distance and a space distance between the terminals.

A DC terminal 315B is a terminal on the positive electrode side that transmits a DC current from the capacitor. A DC terminal 319B is a terminal on the negative electrode side. An AC terminal 320B transmits an AC drive current to the motor.

As illustrated in FIG. 6, a first base 803 and a second base 804 made of metal are arranged such that their main surfaces face each other. As illustrated in FIG. 3, the first base 803 forms fins 800 to improve the heat transfer coefficient for a refrigerant. The second base 804 also forms a fin. The first base 803 and the second base 804 are not particularly limited as long as they are metal materials, but copper or aluminum is desirable in terms of heat dissipation, and aluminum is desirable in terms of cost. As illustrated in FIG. 1, when the flow path cover 1003 is laser-welded to the first base 803, it is particularly desirable to use a pure aluminum-based first base 803 in order to prevent voids due to evaporation of impurities.

A sealing material 603 illustrated in FIGS. 1 and 6 collectively seals the semiconductor element 860, the first base 803, the second base 804, and the like by transfer molding. The sealing material 603 is not particularly limited as long as it is a sealing material to be subjected to transfer molding, but preferably has a glass transition temperature of 150° C. or higher in terms of heat resistance. A fixing portion 612 is a part that is fixed to the housing 12 described later. An opening 611 is formed in the flow path cover 1003, and allows the refrigerant to flow in and out of the flow path.

The DC terminal 315B and the DC terminal 319B protrude in a line from one surface of the power semiconductor device 140. Since the DC terminal 315B and the DC terminal 319B are adjacent to each other, there is an effect that input and output currents are made close to each other to reduce inductance. Further, the DC terminal 315B and the DC terminal 319B protrude from one surface to be connected to the capacitor module 500 connected to the battery, so that the inverter layout can be simplified. The AC terminal 320B protrudes from the surface of the power semiconductor unit 300 on the opposite side of a side on which the DC terminal 315B and the DC terminal 319B are arranged. With this configuration, since the output from the inverter is connected to the motor after connection to the current sensor, the DC terminal 315B and the DC terminal 319B connected to the capacitor module 500 are in different directions from each other, so that the inverter layout can be simplified.

Using FIG. 4, the relation among a first terminal 600 according to this embodiment, a second terminal 601, an intermediate portion 604 provided in the second terminal 601, a protrusion portion 606, and a first flow path forming portion 605 will be described.

The first terminal 600 and the second terminal 601 correspond to the AC terminal 320B, the DC terminal 315B, and the DC terminal 319B illustrated in FIGS. 1 to 3. The protrusion portion 606 is a portion protruding from the sealing material 603 in the first terminal 600 and the second terminal 601. On the other hand, the intermediate portion 604 is covered with the sealing material 603 in the first terminal 600 and the second terminal 601. Since the protrusion portion 606 is not covered with the sealing material 603, it is necessary to secure a creepage distance and a space distance which a high-voltage device should satisfy.

When a large current of 300 A or more flows to the first terminal 600 and the second terminal 601, the first terminal 600 and the second terminal 601 generate heat. Due to this heat generation, the temperature of the intermediate portion 604 may be higher than the glass transition temperature of the sealing material 603. At a temperature higher than the glass transition temperature, the adhesion of the sealing material 603 may be reduced.

The intermediate portion 604 is a part of the first terminal 600 or the second terminal 601 formed integrally with the protrusion portion 606, and is a portion located outside the electrical connection portion such as the power semiconductor element 860 or the like.

If the cost is reduced without expanding the expensive insulating substrate where the power semiconductor element 860 is mounted and the terminal interval is increased so that the creepage distance and the space distance which a high-voltage device should satisfy are secured, the second terminal 601 located outside the power semiconductor device 140 is extended outside. On the other side, as the distance between the second terminals 601 increases, the electric resistance increases and the amount of heat generated increases.

As illustrated in FIGS. 5 and 6, heat generated in the intermediate portion 604 is transmitted to the first base 803 and the second base 804 via a cooling path 613.

Since the first base 803 and the second base 804 are made of a metal material having a high thermal conductivity, and the first base 803 and the second base 804 themselves have a region in contact with the flow path, the heat transferred is cooled via a refrigerant. In this way, with the first base 803 and the second base 804 on both sides of the intermediate portion 604, there is an effect that the first terminal 600 or the second terminal 601 is excellent in heat dissipation.

The coolant is isolated from the sealing material 603 by a metal material such as the first base 803, the second base 804, and the flow path cover 1003. Thereby, it is possible to prevent the sealing material from absorbing moisture due to the cooling water, and to secure high insulation properties.

Figure 7:
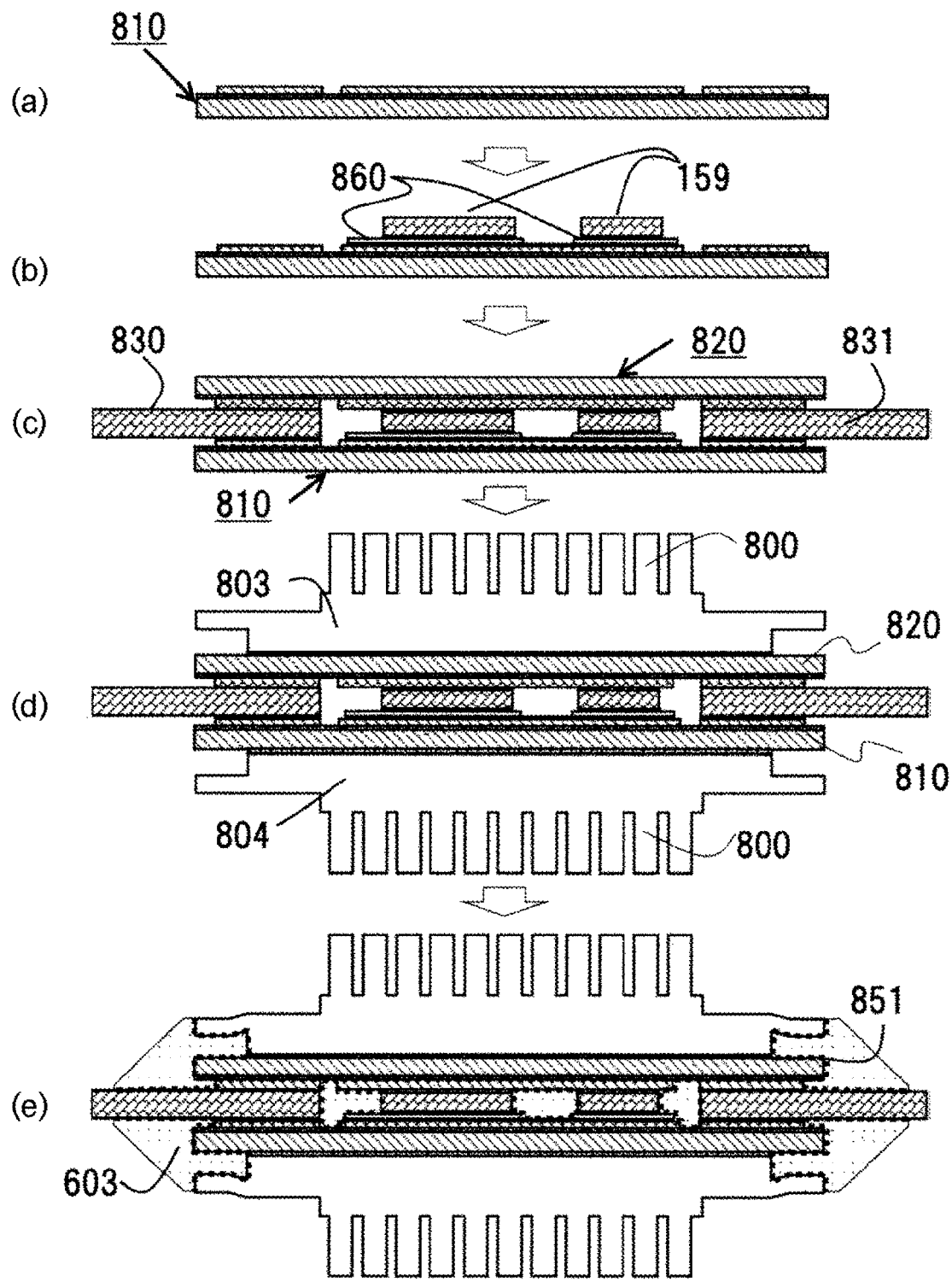
FIG. 7 is a cross-sectional view of a manufacturing process comprising steps a through e of the power semiconductor device 140.

The manufacturing procedure of the power semiconductor device 140 according to this embodiment will be described with reference to FIGS. 7 to 11. FIG. 7 is a cross-sectional view of the manufacturing process of the power semiconductor device 140.

As illustrated in Step (a) of FIG. 7, a collector-side substrate 810 on which a conductor is mounted is prepared.

As illustrated in Step (b) of FIG. 7, the semiconductor element 860 is connected to the collector-side substrate 810 via a connection member such as solder or sintered metal. Further, the metal block 159 is connected to the semiconductor element 860 via a connection member such as solder or sintered metal. The metal block 159 is not particularly limited as long as it is a metal material having electric conductivity, but copper having high electric conductivity is desirable, and aluminum may be used for weight reduction. Plating or the like may be applied to the surface of the metal block to ensure connection with the connection member. Further, in the state of Step (b) in FIG. 7, an Al wire (not illustrated) is connected.

As illustrated in Step (c) of FIG. 7, a lead frame 830 and a lead frame 831 are mounted on the conductor of the collector-side substrate 810 via a connection member. Further, an emitter-side substrate 820 is mounted on the conductor of the collector-side substrate 810 and the semiconductor element 860 via a connection member.

Next, as illustrated in Step (d) of FIG. 7, the first base 803 having the fin 800 is connected to the emitter-side substrate 820. The second base 804 having the fin 800 is connected to the collector-side substrate 810.

Next, as illustrated in Step (e) of FIG. 7, the sealing material 603 is filled into a space between the first base 803 and the second base 804 by transfer molding, and a resin portion is formed around the space.

Each member may be covered with a resin thin film 851 at a stage before transfer molding in order to improve the adhesion between the sealing material 603 and other components.

Figure 8:
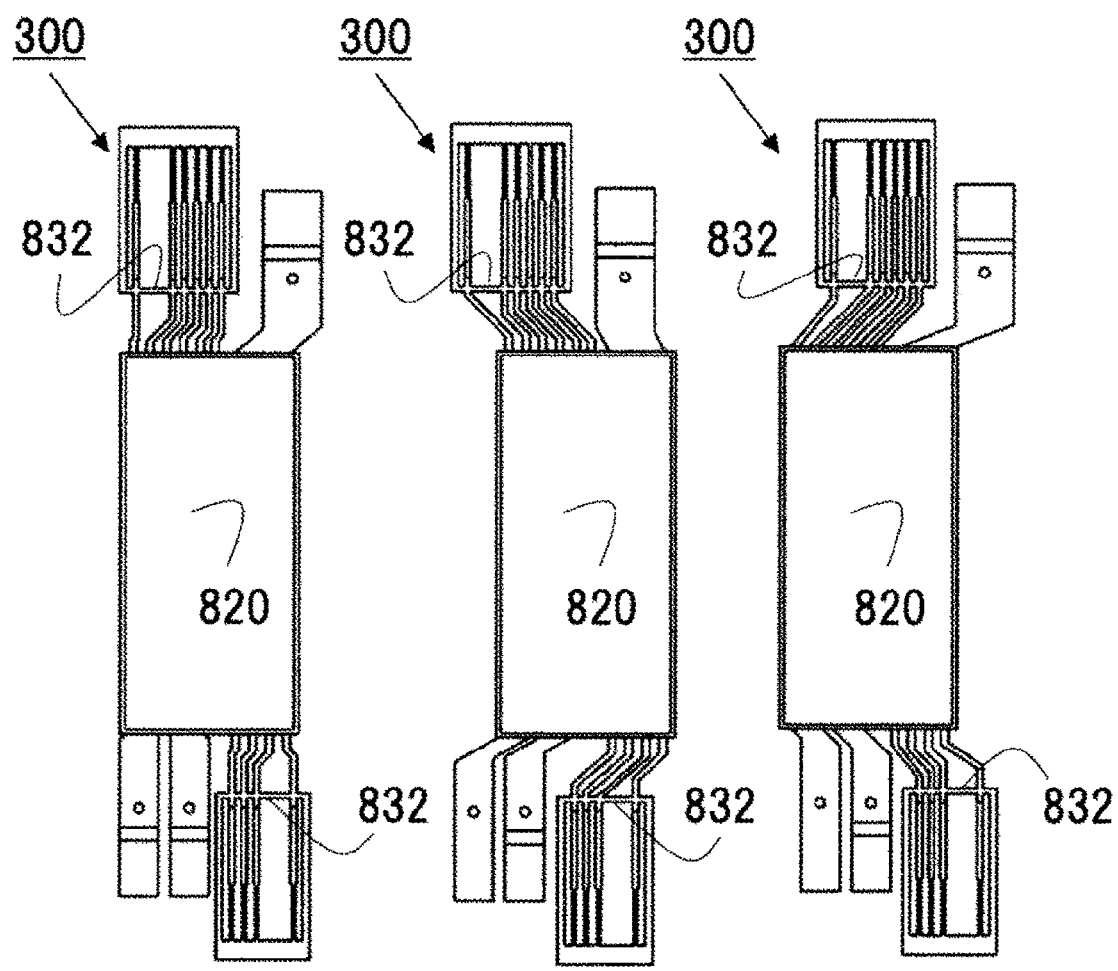
FIG. 8 is a plan view of the power semiconductor unit 300 at the stage of step (c) in FIG. 7.

Next, Steps (c) to (e) illustrated in FIG. 7 will be described in detail. FIG. 8 is a plan view of the power semiconductor unit 300 at the stage of Step (c) in FIG. 7.

The power semiconductor unit 300 has three types of lead frame shapes depending on a place where the power semiconductor unit 300 is mounted thereafter. A tie bar 832 is provided at a control terminal such as an upper arm gate signal terminal 325U to prevent a sealing material from flowing between the control terminals.

Figure 9:
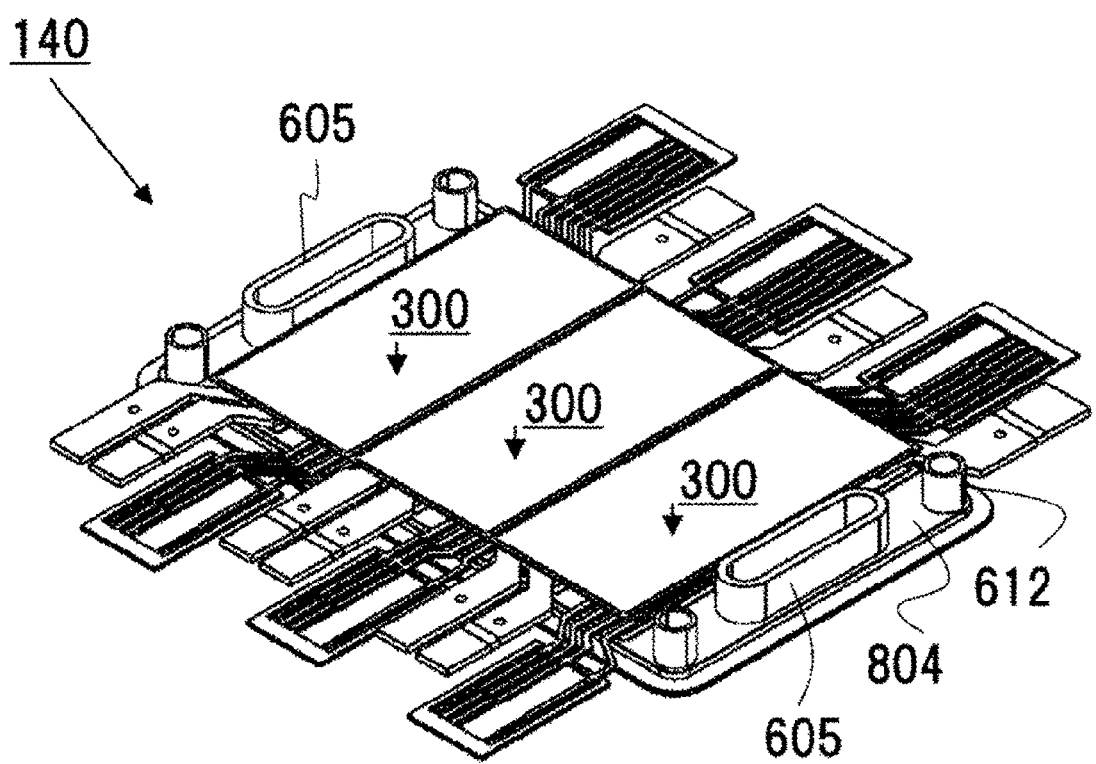
FIG. 9 is a perspective view of a manufacturing process of the power semiconductor device 140 according to this embodiment, centering on a second base 804.

FIG. 9 is a perspective view of a manufacturing process of the power semiconductor device 140 according to this embodiment, centering on the second base 804.

The second base 804 has the first flow path forming portion 605 and the fixing portion 612. The three power semiconductor units 300 are arranged between the two first flow path forming portions 605, and are arranged on the second base 804. By manufacturing the power semiconductor unit 300 in advance and mounting it on the second base 804, the warpage of the power semiconductor unit 300 itself can be reduced. The power semiconductor unit 300 and the second base 804 are bonded using a metal material such as solder. The second base 804 and the first flow path forming portion 605, and the second base 804 and the fixing portion 612 are bonded by metal joining such as laser welding.

Figure 10:
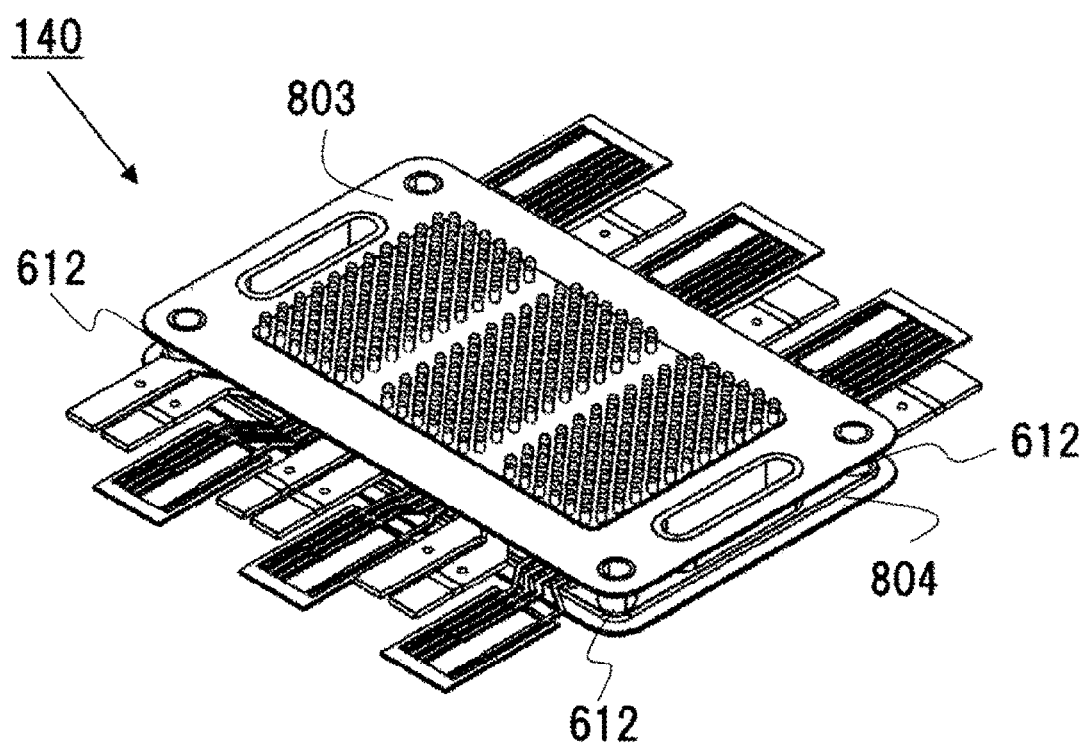
FIG. 10 is a perspective view of a manufacturing process of the power semiconductor device 140 according to the embodiment, centering on a first base 803.

FIG. 10 is a perspective view of a manufacturing process of the power semiconductor device 140 according to this embodiment, centering on the first base 803.

The first base 804 is connected to the three power semiconductor units 300, the fixing portion 612, and the first flow path forming portion 605. The power semiconductor unit 800 and the first base 803 are bonded using a metal material such as solder. The first base 803 and the first flow path forming portion 605, and the first base 803 and the fixing portion 612 are bonded by metal bonding such as laser welding.

Figure 11:
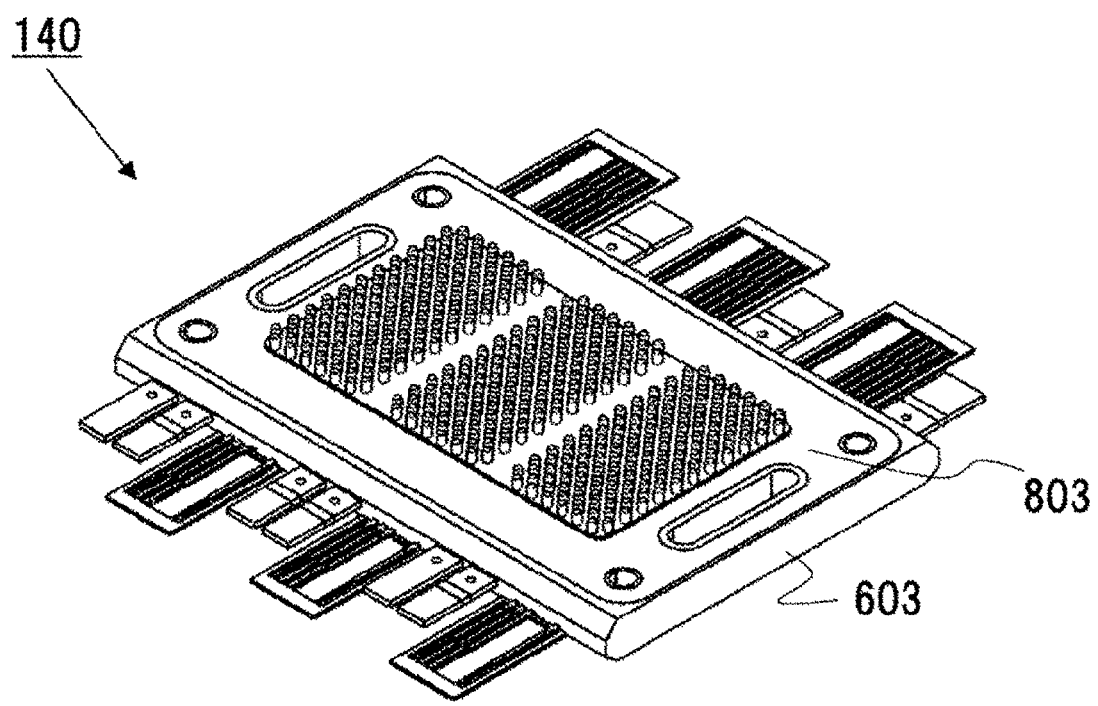
FIG. 11 is a perspective view of a manufacturing process of the power semiconductor device 140 according to this embodiment, centering on a sealing material 603.

FIG. 11 is a perspective view of a manufacturing process of the power semiconductor device 140 according to this embodiment, centering on the sealing material 603.

The space between the first base 803 and the second base 804 is sealed with the sealing material 603 by transfer molding. Collective sealing with transfer mold has the effect of increasing productivity.

Figure 12:
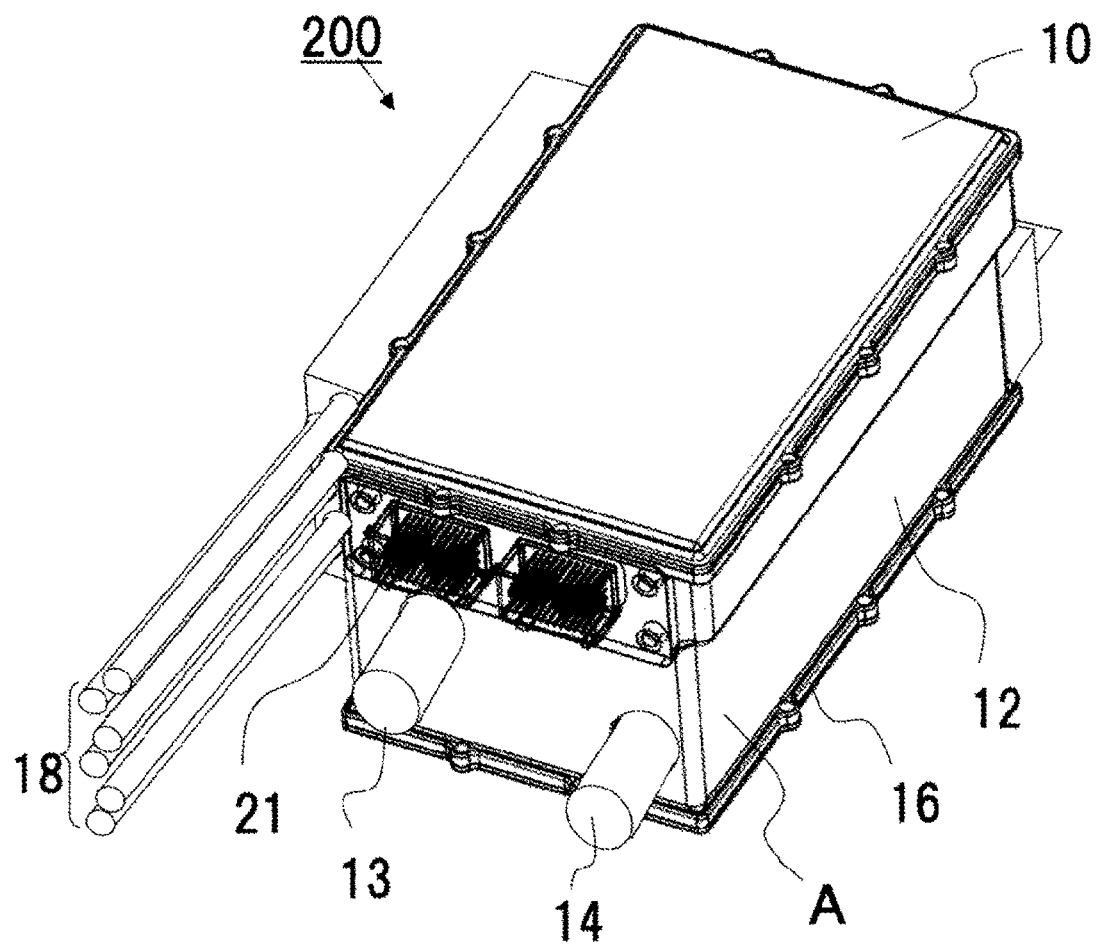
FIG. 12 is a perspective view illustrating the appearance of a power conversion device 200 according to this embodiment on which a power semiconductor device 140 is mounted.

FIG. 12 is a perspective view illustrating the appearance of a power conversion device 200 according to this embodiment on which the power semiconductor device 140 is mounted.

The appearance of the power conversion device 200 according to this embodiment is formed by fixing a housing 12 having a substantially rectangular upper surface or bottom surface, an upper case 10 provided on one of the short-side outer peripheries of the housing 12, and a lower case 16 for closing the lower opening of the housing 12. The housing 12 and the lower case may be formed integrally. Since the shape of the bottom view or the top view of the housing 12 is substantially rectangular, the housing 12 can be easily mounted on a vehicle and can be easily manufactured. The coolant inlet 13 allows the coolant to flow into one surface of the housing 12, and the coolant outlet 14 allows the coolant to flow out to one surface of the housing 12. A connector 21 transmits and receives a signal for driving the power semiconductor device 140 and the like. An AC terminal 18 connects the power conversion device 200 and the motor, and transmits an AC current.

Figure 13:
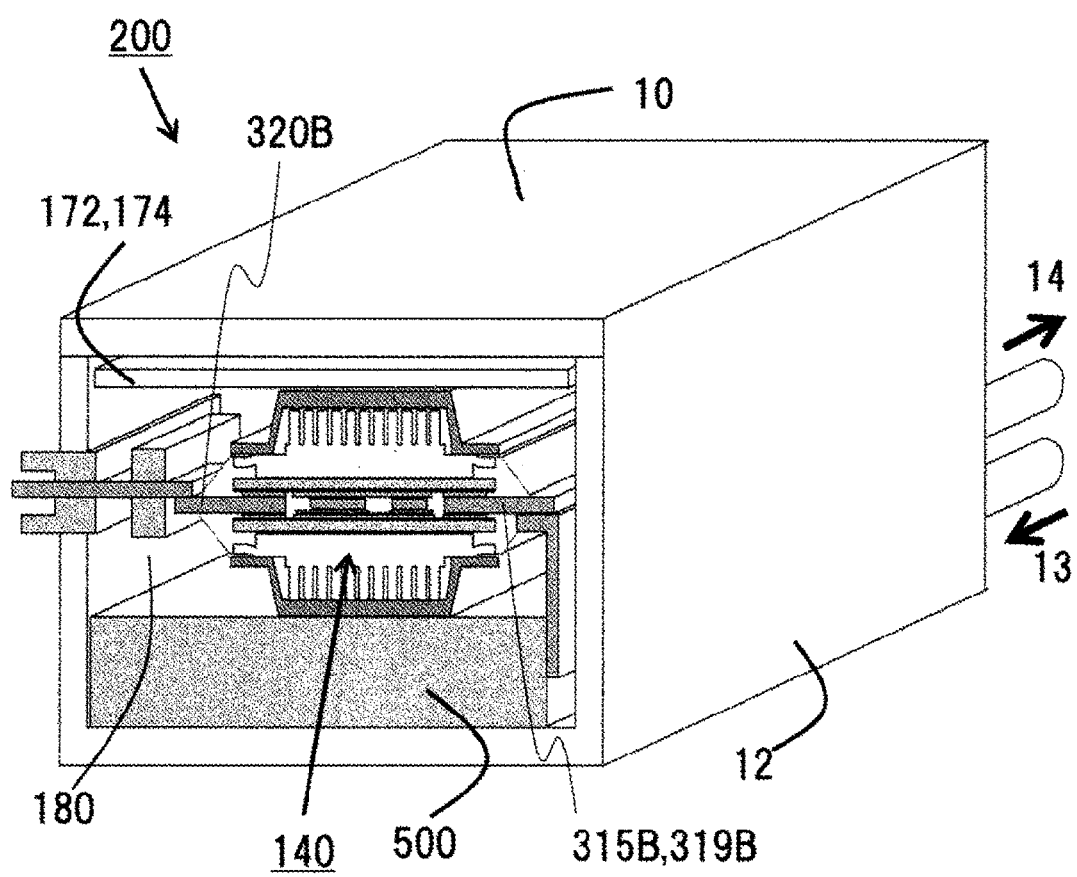
FIG. 13 is a schematic diagram illustrating a cross-sectional structure of the power conversion device 200 according to this embodiment.

FIG. 13 is a schematic diagram illustrating a cross-sectional structure of the power conversion device 200 according to this embodiment.

In the power semiconductor device 140, the AC terminal 320B is welded to a bus bar on which the current sensor 180 is mounted. Further, the DC terminal 315B and the DC terminal 319B of the power semiconductor device 140 are welded to the terminals of the capacitor module 500. Next, the control circuit board 172 on which the mounted components are mounted and the driver circuit board 174 are assembled and connected to the signal terminals. By installing the control circuit board 172 and the driver circuit board 174 in the upper portion of the power semiconductor device 140 in which the flow path is formed, and the capacitor module 500 in the lower portion of the power semiconductor device 140, the power conversion device 200 can be downsized.

REFERENCE SIGNS LIST 10 upper case
12 housing
13 coolant inlet
14 coolant outlet
16 lower case
21 connector
136 battery
140 power semiconductor device
159 metal block
172 control circuit board
174 driver circuit board
180 current sensor
200 power conversion device
300 power semiconductor unit
315B DC terminal on positive electrode side
319B DC terminal on negative electrode side
320B AC terminal
325U upper arm gate signal terminal
325L lower arm gate signal terminal
325S temperature sense signal terminal
325C collector sense signal terminal
600 first terminal
601 second terminal
603 sealing material
604 intermediate portion
605 first flow path forming portion
606 projection
612 fixed member
613 cooling path
800 fin
803 first base portion
804 second base portion
810 collector-side substrate
820 emitter-side substrate
830 lead frame
831 lead frame
832 tie bar
851 resin thin film
860 semiconductor element
1003 flow path cover

The invention claimed is:

1. A power semiconductor device, comprising:
a first semiconductor element having a first terminal and a second semiconductor element having a second terminal, the first and second terminals transmit current to the first and second semiconductor elements, respectively; and
a first base and a second base that are disposed to face each other while interposing a first part of the first terminal, a first part of the second terminal, the first semiconductor element and the second semiconductor element, between the first base and the second base; and
a sealing material that is provided in a space between the first base and the second base,
wherein an end portion of the first terminal and an end portion of the second terminal project outwardly from, and perpendicular to a same side of the semiconductor device such that the end portion of the first terminal is adjacent to and substantially parallel to the end portion of the second terminal on the same side of the semiconductor device;
wherein the first terminal includes a first intermediate portion extending between the end portion of the first terminal and the first semiconductor device;
wherein the second terminal includes a second intermediate portion extending between the end portion of the second terminal and the second semiconductor device;
wherein the first and second intermediate portions are formed in such a way that a lateral separation between the first intermediate portion and the second intermediate portion increases in a direction away from the first and second semiconductor elements and toward the same side of the semiconductor device such that the separation is greatest at the same side, and
the second intermediate portion is provided between the first base and the second base and in the sealing material.

2. The power semiconductor device according to claim 1, wherein the first base is provided with a first flow path forming portion that overlaps with the second intermediate portion and flows a coolant in a thickness direction of the sealing material when viewed from an arrangement direction of the first base and the second base.

3. The power semiconductor device according to claim 1, comprising
a protrusion that is connected to the second intermediate portion and protrudes from the sealing material,
wherein the second intermediate portion is bent at an angle different from that of the protrusion between the semiconductor element and the protrusion.

* * * * *